(12) United States Patent
Mattes et al.

(10) Patent No.: US 7,400,995 B2
(45) Date of Patent: Jul. 15, 2008

(54) DEVICE AND METHOD FOR TESTING INTEGRATED CIRCUITS

(75) Inventors: Heinz Mattes, München (DE); Sebastian Sattler, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/566,461

(22) PCT Filed: Jul. 8, 2004

(86) PCT No.: PCT/DE2004/001487

§ 371 (c)(1),
(2), (4) Date: Sep. 18, 2006

(87) PCT Pub. No.: WO2005/012933

PCT Pub. Date: Feb. 10, 2005

(65) Prior Publication Data

US 2007/0067129 A1    Mar. 22, 2007

(30) Foreign Application Priority Data

Jul. 30, 2003   (DE)   ............................... 103 35 164

(51) Int. Cl.
*G06F 19/00*   (2006.01)
(52) U.S. Cl. ...................................... 702/118; 702/189
(58) Field of Classification Search ................. 702/108, 702/117, 118, 189; 324/74, 73.1, 765; 340/870.21; 341/120, 128; 710/69; 323/288; 327/31, 327/134
See application file for complete search history.

(56) References Cited

U.S. PATENT DOCUMENTS

| 4,238,695 | A | * | 12/1980 | Hock | ........................... 327/89 |
| 5,107,205 | A | * | 4/1992 | Ebihara | ..................... 714/740 |
| 5,283,515 | A | | 2/1994 | Jordan | |
| 5,424,677 | A | * | 6/1995 | Carson | .......................... 330/2 |
| 5,768,118 | A | * | 6/1998 | Faulk et al. | ................... 363/72 |
| 5,870,042 | A | * | 2/1999 | Noda | ......................... 341/120 |
| 6,229,465 | B1 | | 5/2001 | Bulaga et al. | |
| 6,344,749 | B1 | * | 2/2002 | Williams | .................... 324/620 |
| 6,492,797 | B1 | | 12/2002 | Maassen et al. | |
| 6,586,980 | B1 | * | 7/2003 | Callahan, Jr. | ............... 327/170 |
| 6,653,872 | B2 | * | 11/2003 | MacGugan | ................. 327/101 |
| 6,703,885 | B1 | * | 3/2004 | Fan et al. | ..................... 327/308 |
| 6,766,266 | B1 | * | 7/2004 | Sakaguchi | .................. 702/117 |

(Continued)

FOREIGN PATENT DOCUMENTS

DE    2626899    12/1977

(Continued)

*Primary Examiner*—Edward Raymond
*Assistant Examiner*—Elias Desta
(74) *Attorney, Agent, or Firm*—Dicke, Billig, Czaja, PLLC (57) ABSTRACT

A test device and method is disclosed. In one embodiment, the test device includes a precision signal generator for generating a test signal, which generator is connected via a respective connecting line to a respective input contact intended for connection to an input of an integrated circuit, and at least one reference signal generator for generating a reference signal. Furthermore, at least one comparator unit is provided for a respective input contact said comparator unit being able to be operated in a test mode. In the test mode, the test signal is compared with the reference signal. The precision signal generator is turned off by the comparator unit if the test signal exceeds or falls below the reference signal.

18 Claims, 5 Drawing Sheets

U.S. PATENT DOCUMENTS 6,931,579 B2 * 8/2005 Roberts et al. .............. 714/724
2005/0007089 A1 * 1/2005 Niiyama et al. ............. 323/284

FOREIGN PATENT DOCUMENTS

| JP | 11-118872 | 4/1999 |
|----|-----------|--------|
| WO | 00/33465  | 6/2000 |
| WO | 01/29571  | 4/2001 |

* cited by examiner

DEVICE AND METHOD FOR TESTING INTEGRATED CIRCUITS

CROSS-REFERENCE TO RELATED APPLICATION

This Utility Patent Application claims the benefit of the filing date of Application No. DE 103 35 164.7, filed Jul. 30, 2003 and International Application No. PCT/DE2004/001487 filed Jul. 8, 2004, both of which are herein incorporated by reference.

FIELD OF THE INVENTION

The invention relates to a device and also a method for parallel testing of integrated circuits.

BACKGROUND

The production test of integrated circuits constitutes a significant cost factor in the production of such integrated circuits. In order to optimize the costs arising during the production test of integrated circuits, it is often attempted to utilize the capacity of the available test apparatuses in the best possible manner. If the test algorithm with which the integrated circuits are tested is optimized for a minimum test time, all possibilities for reducing costs have already been exhausted in the case of this approach.

A further approach for testing integrated circuits consists in checking a plurality of integrated circuits simultaneously on a tester. This requires correspondingly converting the testers used, in particular adapting the load board for receiving a plurality of integrated circuits. In this case a load board is understood to be a receptacle which is used during such a test and is able to receive one or a plurality of integrated circuits to be tested. In the case of parallel tests of integrated circuits that have been carried out in this way, it has not been possible heretofore to supply the integrated circuits to be tested with the same signal level. Therefore, the results of such parallel tests of integrated circuits often have only little meaningfulness. This has the effect that in such parallel tests, inherently defect-free integrated circuits are sorted out and defective integrated circuits are deemed to be good.

SUMMARY

The present invention provides a device and also a method by means of which a parallel test of integrated circuits that supplies reliable and meaningful test results can be carried out in a simple manner.

In one embodiment, the invention relates to a test device for testing integrated circuits, in particular dynamic analog-to-digital converters/AD converters, and also sigma-delta converters. In this case, the present invention is not limited to the test of such converters, but rather can be used wherever analog voltages with high accuracy are required.

The test device according to the invention has a common precision signal generator, which generates a test signal, in particular an analog ramp voltage or a sinusoidal voltage or current profile, and which is connected via connecting lines to input contacts—arranged in particular on the load board—for the integrated circuits to be tested. Furthermore, the test device comprises at least one reference signal-generator, in particular a reference voltage source, which can generate a constant reference signal, in particular a limit voltage value. In this case, the reference signal represents a maximum value or a minimum value which the test signal is intended to exceed or fall below. In this case, the reference signal generator is constructed in such a way that it can make available a very accurate test signal reference, in particular a very accurate voltage reference. Apart from the requirement of amplitude accuracy, the requirements made of the reference signal generator are not particularly stringent because the reference signal is only operated virtually in nonloaded fashion and has to be stable only during a measurement cycle that usually lasts a few hundred milliseconds.

Each input contact has at least one comparator unit which is arranged close to the input contact and which can be operated in a test mode. In the test mode, it is possible to ascertain individually for each integrated circuit to be tested whether the value of the test signal becomes too large or too small or whether the test signal exceeds or falls below the reference signal. In this case, the precision signal generator can be switched off directly by the relevant comparator unit.

In accordance with a basic concept of the invention, the parallelization of the test ensures that n integrated circuits can be tested simultaneously. This reduces the total test time by the factor n. The device equipment of the tester used remains the same. Only the load board has to be adapted for receiving a plurality of integrated circuits.

The integrated circuits are supplied with the same input signal by a common precision signal generator. By contrast, the digital outputs of the integrated circuits are evaluated separately.

The fact that the comparator unit is in each case arranged directly at the input contact assigned to it ensures that the test signals which are present directly at the integrated circuit are in each case detected and taken into consideration. This is because between the precision signal generator and the input contacts, the test signals are passed via a plurality of board planes to the integrated circuit to be tested. Each of the transitions between the board planes has an ohmic contact resistance. Due to possible soiling, oxidation or wear, it is scarcely possible to ensure the exact control of these resistances during production use. Even when there are extremely small currents, this may lead to considerable voltage drops on the path from the precision signal generator to the respective integrated circuit.

In accordance with a first embodiment of the invention, the test device includes two reference signal generators. In this case, the first reference signal generator generates a lower reference signal and the second reference signal generator generates an upper reference signal. In the case of this embodiment, each input contact has two comparator units, to be precise a first comparator unit, which is connected to the first reference signal generator, and a second comparator unit, which is connected to the second reference signal generator. This ensures that the integrated circuits are only tested with test signals which are arranged within the test interval spanned by the lower and upper reference signals. As a result, the test signal values actually present at the input contacts of the integrated circuits can be reliably controlled.

In accordance with a further embodiment of the invention, in each case two lines, namely a calibration line and a reference line, are led from the reference signal generator or from the reference signal generators to the comparator unit(s). Furthermore, each comparator unit also includes a calibration unit, to the control input of which the output of the comparator unit is led in each case. The calibration line and the reference line are led as closely as possible together with the signal line, so that all these lines experience the same external disturbances. The comparator unit can also be operated in a calibration mode, in which the switching properties of the comparator unit, in particular the offset/deviation with respect to the zero value and the hysteresis/subsequent action of the test signal after the turn-off are set by means of the signal values present on the calibration line and on the reference line of the calibration unit being compared with one another.

The integrated circuits to be tested in parallel may have different manufacturing-dictated internal offsets. By virtue of the fact that all the integrated circuits are connected to a common signal generator, offset errors may occur which identify a good integrated circuit as defective and thus lead to a reduction of the yield. Such offset errors are reliably avoided through the adjustment of the offsets in the calibration mode.

The calibration mode, which is to be performed in particular at the beginning of testing, ensures that the comparator unit switches exactly at the same voltages and that the precision signal generator is turned off in the test mode exactly when the value of the reference signal is reached.

For this purpose, it must be ensured that the comparator unit(s) has/have a high-impedance input, thereby ensuring that no currents flow via the calibration line and via the reference line and, consequently, no voltage drop occurs on these two lines even in the case of relatively large contact resistances. It is thereby ensured that the reference voltage is present exactly at the input of the comparator unit(s) independently of the quality of the lead routing.

In accordance with a further basic concept of the invention, the provision of this calibration mode ensures that all the integrated circuits to be tested in parallel are supplied with exactly the same voltage levels. The test values actually present at the input contacts of the integrated circuit are known and do not exceed/fall below the reference signal values generated by the reference signal generators. The accuracy and the reliability of the input signals and hence of the test results can thereby be significantly increased.

This is because the input pins of the different integrated circuits are situated spatially separately from one another on the load board. Without such a calibration mode, the input signals actually present at the input contacts, even if a common precision signal generator is present, are different and not identical to the expected test signal due to the line routing, due to the transition resistances and due to the external interference influences.

In one advantageous development of the invention, the comparator unit(s) can be switched back and forth between the test mode and the calibration mode, so that the calibration mode and the test mode can be performed one after the other or alternately.

In a form of realization of the test device according to the invention that can be produced in a simple manner, each comparator unit includes a comparator in each case. It is particularly simple and cost-effective if the test device includes a respective comparator having two inputs and having an output. The first input of each comparator is connected to the reference line of the relevant reference signal generator, and the second input of each comparator can be connected to the calibration line of the relevant reference signal generator and to the connecting line of its input contact. The output of each comparator can be connected to its calibration unit and to the precision signal generator. In this case, the switching properties, in particular the offset and the hysteresis of the comparator, can be set by means of the calibration unit.

If a decision logic unit is provided, furthermore, which is connected to the comparator units and which can generate control signals for the precision signal generator from the output signals of the comparator units, the comparator units or the comparators can be calibrated in parallel prior to the beginning of a test cycle. A further acceleration of the test can thereby be achieved.

On account of external disturbances or due to the influence of the different signal paths, it is possible that the test mode in the case of the different integrated circuits will start and end at slightly offset points in time. In order to prevent this, the respectively valid time window is communicated to the evaluation logic of the tester. For this purpose, the invention provides a respective validation signal line leading from each comparator unit to the relevant output line which attaches to the output contact of the integrated circuit to be tested. Via said validation signal line, a validation signal is passed to the respective output line, in particular to an AND gate arranged downstream of the output contact, where it is logically combined with the digital output of each integrated circuit.

The above-described test device according to embodiments of the invention can be realized in various ways. The different instances of the test device according to the invention in this case differ merely in the partitioning or in the arrangement of the individual elements of the test device according to the invention. Depending on the availability of circuit area on the integrated circuits, individual elements or even all of the elements of the test device described can be taken up into the integrated circuits as a BIST/Built-In-Self-Test circuit. Cost savings can be attained depending on how many elements of the test device according to the invention can be taken up on the integrated circuit.

The invention also relates to an integrated circuit having a test device described above. In this case, the test device is monolithically integrated on said integrated circuit and formed in addition to the actual circuit of the integrated circuit. In this case, it is possible for the common precision signal generator to be replaced by local digital signal sources formed in the integrated circuits. This on-chip solution is particularly cost-effective.

In the case of this form of realization of the test device, the entire arrangement of the test device described having the precision signal generator, having the comparator unit or having the comparator and having the calibration unit and also having the reference signal generators can be positioned on the integrated circuit. However, this presupposes that the additional chip area required for this purpose is available. Particularly in the case of integrated circuits in which the switching area is only limited by the number of connecting contacts to be applied, there is generally enough chip area available. In the case of this form of realization of the invention, a filter, in particular a low-pass filter, which is able to convert a test signal generated into a desired analog signal, is additionally required on the load board for each integrated circuit. The reference voltage sources may be realized for example by highly stable and temperature-compensated band gaps. This embodiment of the test device according to the invention is particularly optimal in respect of costs, especially as it no longer presupposes any specific tester properties whatsoever and can be employed particularly diversely.

The above-described test device according to the invention may furthermore be formed on a load board for receiving at least one needle card for testing integrated circuits and/or having at least one test receptacle for testing integrated circuits and/or for connecting a handler to a tester of integrated circuits. In this case, all the elements of the test device described above can be positioned on the load board.

As an alternative thereto, in the case where the test device is formed on the load board, it is also possible for the central precision signal generator of the tester to be replaced by digital signal sources which are taken up locally into the integrated circuits. The comparator units or the comparators are positioned on the load board in the case of this arrangement and can control the internal precision signal generators. This presupposes that the integrated circuit has an external control interface, such as e.g. an I²C bus. This is the case for many mixed-signal modules. Therefore, these are particularly suitable for this solution.

The invention furthermore relates to a tester for testing integrated circuits, which has a plurality of instruments for generating signals or data streams and a plurality of measuring sensors, in particular for currents and voltages. The tester furthermore comprises a load board described above and a test device likewise described above. In this case, the precision signal generator and the reference signal generator(s) are arranged on the tester and the comparator units or the comparators with the calibration units are arranged on the load board, in each case adjacent to the input contacts for the integrated circuits. A tester with a test device arranged in this way can test in parallel a virtually arbitrary number of integrated circuits, the test device according to the invention ensuring that the test results obtained in the process are reliable.

The invention also relates to a method for parallel testing of a plurality of integrated circuits. In this case, firstly provision is made of a tester having a load board already described. The load board is populated with a plurality of integrated circuits. In this case, the tester, the load board or the integrated circuits are present in one of the forms of realization described above and have a precision signal generator, at least one reference signal generator and a respective comparator unit or a comparator with a calibration unit for each integrated circuit.

The test mode that is then to be carried out is carried out as follows. Firstly, a test signal is generated by a precision signal generator and is applied to the integrated circuits. At least one reference signal is then generated by the reference signal generator(s) and applied to the comparator units. The test signals and the reference signals are present in particular as voltages.

In particular, the reference line of the reference signal generator and the signal line of the precision signal generator are present at the inputs of the comparator unit. The output of the comparator units is led in particular to a control input of the precision signal generator.

The test signal and the respective reference signals are then compared with one another by the comparator units. At the beginning of the measurement, the precision signal generator starts with a test signal value of zero and rises linearly with time. If the test signal reaches the reference value, the relevant comparator unit switches and turns off the precision signal generator. The measurement operation is then concluded. The precision signal generator can be reset for the next measurement cycle.

This method ensures that test signals lying within a desired interval are applied to the integrated circuits. Reliable and dependable test results are thereby produced.

In one advantageous development of the method described, a calibration mode is carried out before or after the test mode is carried out. In the case of said calibration mode, the inputs of the comparator units are in each case connected to the calibration line and to the reference line of the relevant reference signal generator. The switching properties of the comparator units are then set by means of the signal values of the calibration line and of the reference line which are present at the relevant comparator units. In this case, in particular the offset and the hysteresis of the comparator unit are adjusted by the calibration unit until said comparator unit switches exactly upon voltage identity. It is thereby ensured that the reference signal is present exactly at the input of the comparator unit independently of the quality of the lead routing. Particularly accurate and reliable test results can be obtained by application of the calibration mode.

The method according to the invention can be carried out by means of an above-described test device and also by means of an above-described integrated circuit having such a test device, by means of an above-described load board having such a test device, and by means of an above-described tester having such a device. The possibilities for the use of the method according to the invention are accordingly extremely diverse.

The invention is also realized in a computer program for executing the method for parallel testing of integrated circuits. In this case, the computer program contains program instructions which cause a computer system to execute such test methods in an embodiment described above. In this case, in particular the method process of the test mode and of the calibration mode are controlled by means of a computer system or carried out on a computer system itself. The computer program outputs the results of the tested integrated circuits as digital data sequences or in a form of representation generated therefrom on an output unit, in particular on a screen or on a printer, or stores these result data in a memory area. Integrated circuits can be tested rapidly, effectively and reliably by means of the computer program according to the invention, the parallel treatment of a plurality of circuits resulting in a significant acceleration of the test run time.

The invention additionally relates to a computer program, which is contained on a storage medium, in particular in a computer memory or in a random access memory, or which is transmitted on an electrical carrier signal. The invention also relates to a carrier medium, in particular a data carrier, such as e.g. a floppy disk, a Zip drive, a streamer, a CD or a DVD, on which a computer program described above is stored. Furthermore, the invention relates to a computer system, on which such a computer program is stored. Finally, the invention also relates to a download method, in which such a computer program is downloaded from an electronic data network, such as from the Internet, for example, onto a computer connected to the data network.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
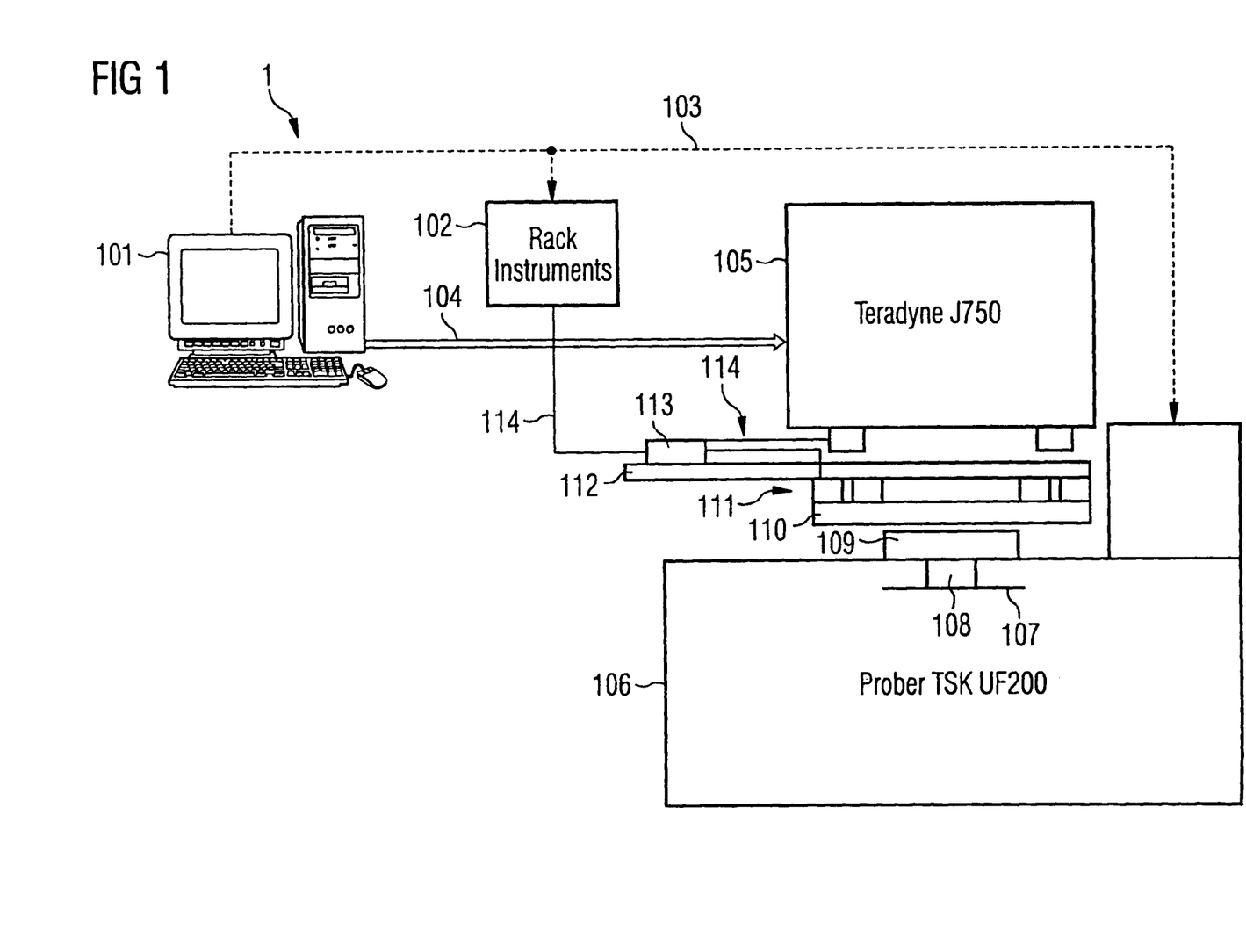
FIG. 1 illustrates one embodiment of a schematic illustration of a tester setup.

FIG. 1 illustrates one embodiment of a schematic illustration of a tester setup 1.

The tester setup 1 comprises a control computer system 101, which is connected via a network line 103 to the signal generators and measuring instruments 102—designated as "rack instruments" in FIG. 1—and to a measurement table 106 and also via a control line 104 to the tester 105. Situated on the measurement table 106 is a bearing area 107, often also referred to as a chuck. Semiconductor wafers with integrated circuits to be tested, or integrated circuits that have already been separated, which are not shown in FIG. 1, bear on said bearing area 107. They are contact-connected by a receptacle for housed components or by a needle card 108 and connected to a switching matrix 113 via a first intermediate plane 109, via a second intermediate plane 110, via a third intermediate plane 111 and via a fourth intermediate plane 112 and via measurement data lines 114. A load board provided for receiving one or a plurality of integrated circuits is likewise not illustrated in FIG. 1.

The switching matrix 113 is connected to the tester 105 and to the measuring instruments 102 by means of measurement data lines 114. In this case, the switching matrix 113 is constructed in such a way that it can conduct the signals of the measuring instruments 102 and the input data of the tester 105 via the intermediate planes 109-112 to specific connecting contacts of the needle card 108 or to specific connecting contacts of the load board (not shown in FIG. 1). The lines connecting the load board to the tester 105 are also referred to as "tester channels".

The tester 105 is a cost-effective tester which operates digitally and which may be equipped with optional analog measuring devices and analog generators. In this case, the highly sensitive measuring instruments 102 that operate highly accurately are arranged at a specific distance from the measurement table 106 and from the tester 105 in a separate measuring instrument cabinet.

The data lines between the measuring instruments 102 and the connecting contacts of the needle card 108 and also of the load board have a length of up to 2 m. This long line routing and the ohmic contact resistances of the transitions between the intermediate planes 109-112 result in voltage drops of the measurement signals generated by the measuring instruments 102 at the test contacts of the needle card 108 and of the load board.

Figure 2:
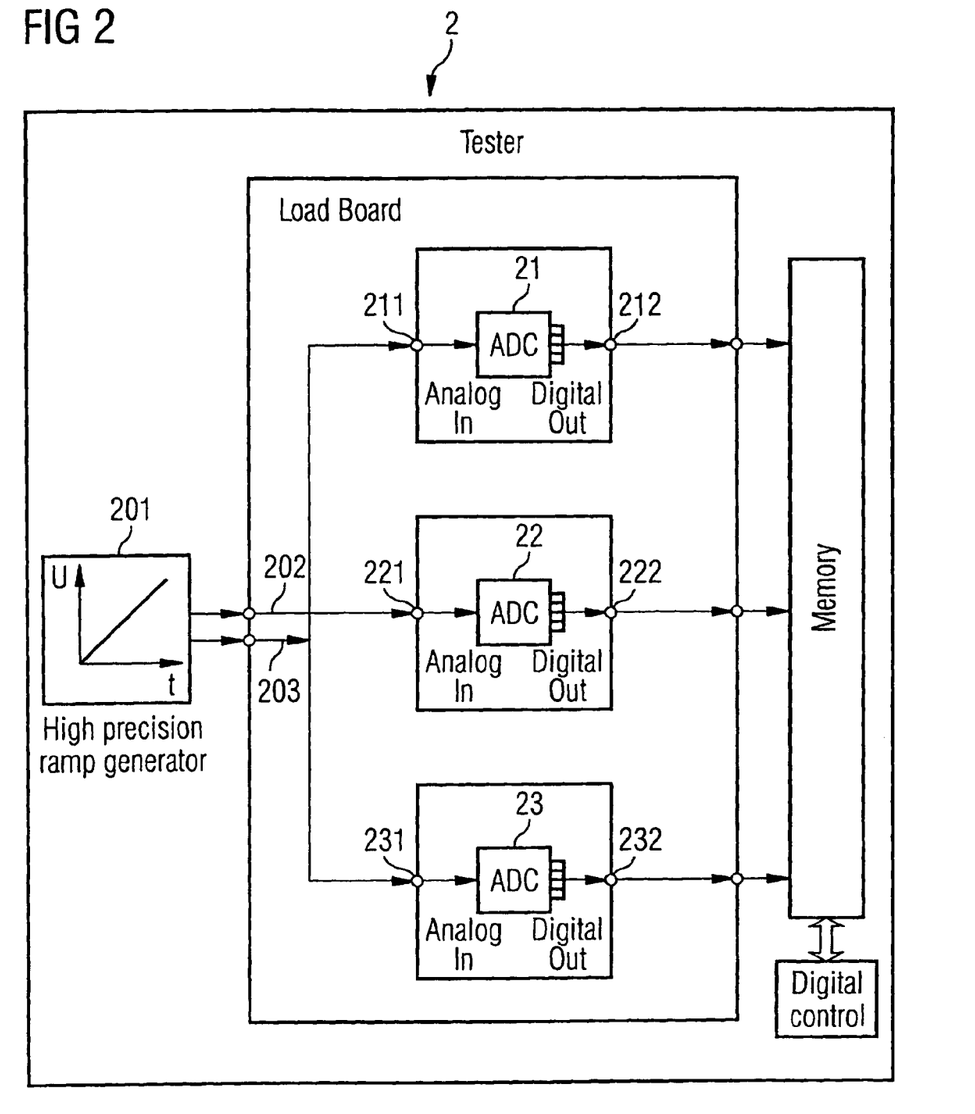
FIG. 2 illustrates one embodiment of a first parallel test illustration with three AD converters.

FIG. 2 illustrates a first parallel test illustration 2 with three AD converters.

In the case of the first parallel test illustration 2, provision is made of a precision signal generator 201 arranged at the measuring instruments 102, said precision signal generator being able to generate an analog ramp voltage. Said ramp voltage is applied via a first test signal line 202 to a first input contact 211, to a second input contact 221 and to a third input contact 231. Said ramp voltage present at the input contacts 211, 221 and 231 is processed by a first AD converter 21, by a second AD converter 22 and by a third AD converter 23. The digital output values respectively generated by the AD converters 21-23 depending on the analog ramp voltage are forwarded from output contacts 212, 222 and 232 to a memory area of the tester 105, said memory area not being specifically designated in FIG. 2. The input contacts 211, 221 and 231 and also the output contacts 212, 222 and 232 are arranged on the load board.

Afterward, the measured output values are compared with the expected desired values by the tester 105, which thereupon outputs a fail signal or a pass signal stating whether or not the relevant AD converter has passed the test.

In order to check that the voltage output by the precision signal generator 201 reaches the AD converters 21-23, a first reference line 203 is led in parallel with the first test signal line 202 and returns the fed-in voltage value to the tester 105 again. It becomes clear from the illustration in FIG. 2 that said first reference line 203 leads only as far as the branching point of the first test signal line 202 and, accordingly, can return to the tester 105 only the test voltage present at said branching point, but not the actual input voltage present at the input contacts 211, 221 and 231. A branching of the first reference line 203 to the input contacts 211, 221 and 231 is not yet possible on conventional testers.

A check of the contact resistances between the intermediate planes 109-112 illustrated in FIG. 1 is carried out once when setting up the load board with the aid of a TDR measurement/time domain reflectometer measurement.

A precondition in regard to the test carried out in accordance with first parallel test illustration 2 supplying dependable test results consists in the voltage output by the precision signal generator 201 being present unchanged at the input contacts 211, 221 and 231. This is not the case in practice, however, especially as the signal lines, in particular the first test signal line 202, are very long and a considerable voltage drop is generally produced as a result of contact resistances in the line routing. This is because, as can be seen in FIG. 1, the first test signal line 202 leads from the tester 105 via the measurement data lines 114, via the switching matrix 113 and via the intermediate planes 109-112 as far as the input contacts 211, 221 and 231 on the load board. The first parallel test illustration 2 is therefore greatly simplified and only of limited functionality.

Customary testers can be used for the first parallel test illustration 2. Only the load board has to be adapted for receiving a plurality of AD converters 21-23.

Figure 3:
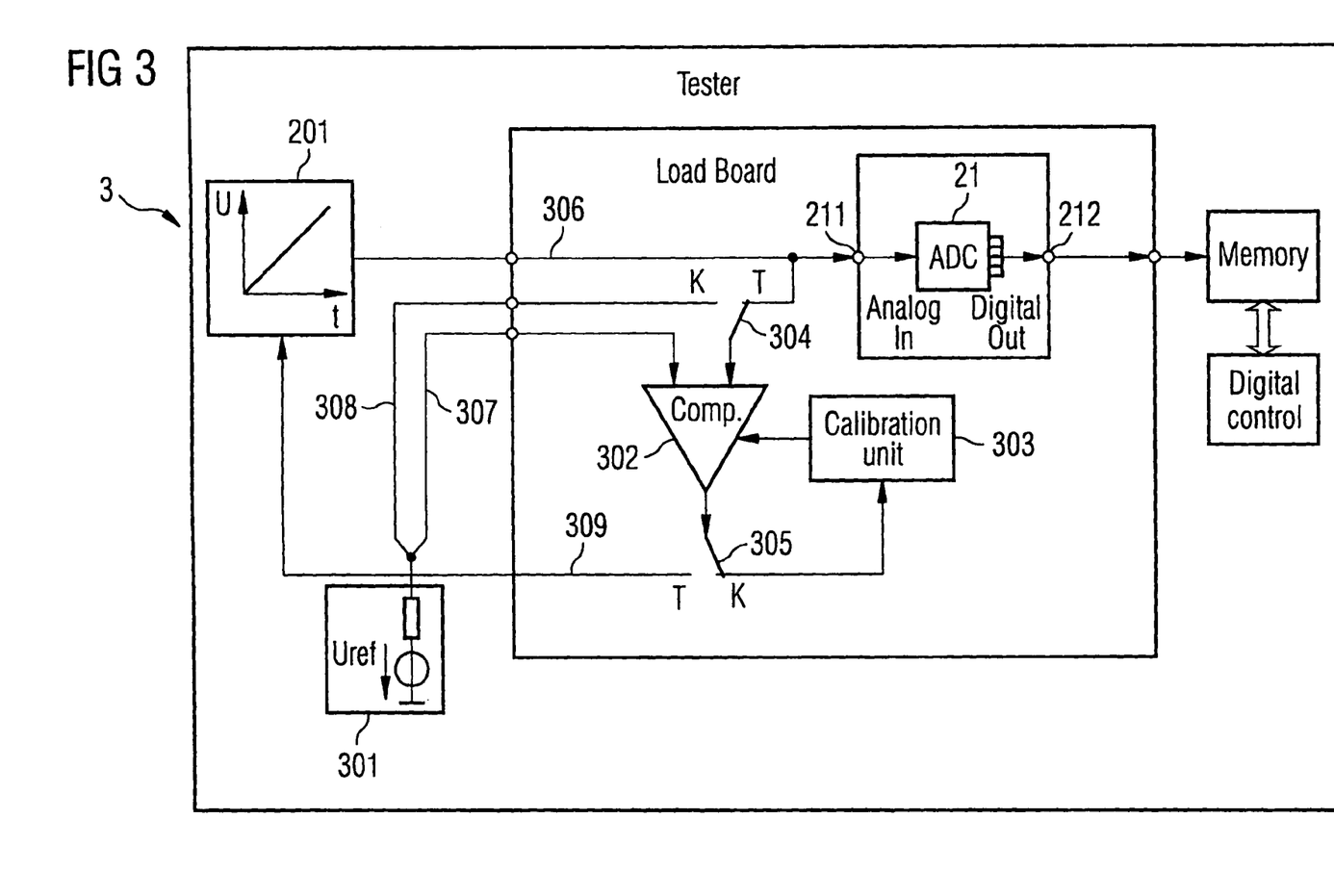
FIG. 3 illustrates one embodiment of a first test circuit diagram for a first AD converter.

FIG. 3 illustrates a first test circuit diagram 3 for the first AD converter 21.

The first test circuit diagram 3 comprises a first reference signal generator 301, which is connected via a long second test signal line 306 and via a plurality of intermediate planes 109-112 to the input contact 211 of the first AD converter 21 to be tested on the load board. A first comparator 302 with a first calibration unit 303 lies very close to the first input contact 211. The first calibration unit 303 is connected to the first comparator 302 and controls the latter. The measuring instruments 102 comprise a first reference signal generator 301, to which a second reference line 307 and also a first calibration line 308 are attached. The second reference line 307 leads to the first input of the first comparator 302. The first calibration line 308 leads to the second input of the comparator 302. A first switch 304 is provided directly upstream of the second input of the first comparator 302, said first switch being constructed in such a way that it can connect the second input of the first comparator 302 either to the first calibration line 308 or to the second test signal line 306. A second switch 305 is arranged at the output of the first comparator 302, said second switch being able to connect the output either to the calibration unit 303 or to a first turn-off line 309 connected to the precision signal generator 201.

The second test signal line 306, the second reference line 307 and the first calibration line 308 are led together as closely as possible so that all three lines experience the same external disturbances. In FIG. 3, the switch positions of the, switches 304 and 305 are designated by the letters "T" for test mode and "K" for calibration mode.

In the present exemplary embodiment, the first reference signal generator 301 is set to the maximum value of the voltage profile of the precision signal generator 201.

In the test mode, the switches 304 and 305 in each case assume the switch position "T". In this case, the voltage of the precision signal generator 302 and the voltage of the first reference signal generator 301 are present at the inputs of the first comparator 302. The output of the first comparator 302 is led to the precision signal generator 201. At the beginning of the test mode, the precision signal generator 201 firstly generates the test voltage value of zero. The generated test voltage values then rise linearly with time. If the test voltage of the precision signal generator 201 reaches the value of the reference voltage, the first comparator 302 switches and thus turns off the precision signal generator 201. The measurement operation is concluded and the precision signal generator 201 can be reset for the next measurement cycle.

This method functions correctly, however, only when the first comparator 302 switches exactly at identical voltages. In order to ensure this, the first comparator 302 must firstly be calibrated before the measurement operation described. For this calibration mode, the switches 304 and 305 are brought to the switch position "K". The first calibration line 308 and the second reference line 307 are now connected to the inputs of the first comparator 302. The output of the first comparator 302 leads to the control input of the first calibration unit 303.

In the calibration mode, the first calibration unit 303 automatically adjusts the offset and the hysteresis of the first comparator 302 until the latter switches exactly upon voltage identity. It is thus ensured that, in the test mode, the precision signal generator 201 is turned off exactly when the reference voltage of the first reference signal generator 301 is reached.

Figure 4:
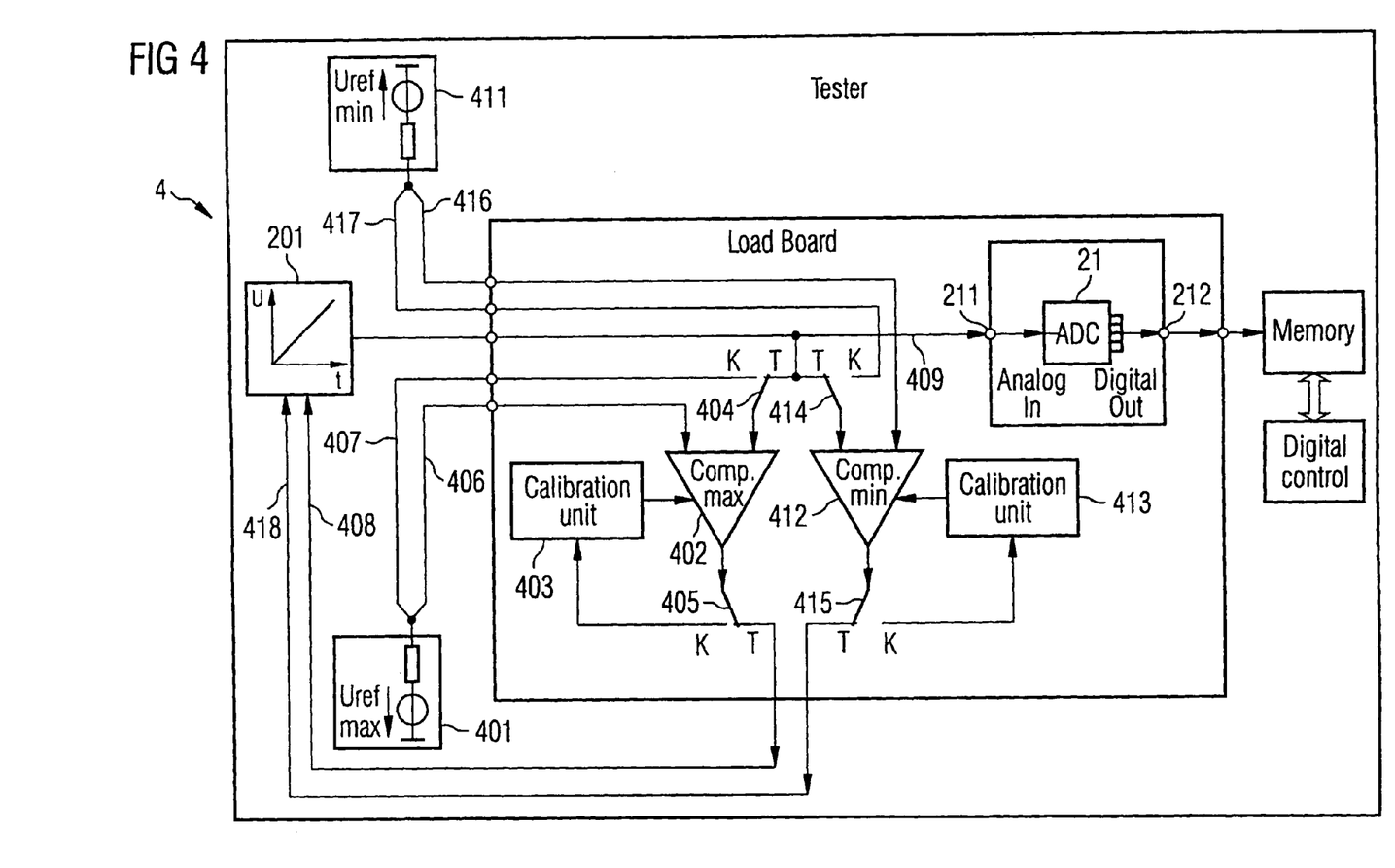
FIG. 4 illustrates one embodiment of a second test circuit diagram for the first AD converter.

FIG. 4 illustrates a second test circuit diagram 4 for the first AD converter 21.

In the case of the second test circuit diagram 4, the calibration method described in FIG. 3 is extended to a two-stage min-max calibration. The second test circuit diagram 4 has a second reference signal generator 401 for generating a maximum reference voltage and a third reference signal generator 411 for generating a minimum reference voltage.

The second reference signal generator 401 is assigned a second comparator 402 and a second calibration unit 403 and also a third switch 404 and a fourth switch 405. The construction and the connection of these elements corresponds to the construction described in FIG. 3. The third reference signal generator 411 is assigned a third comparator 412 and a third calibration unit 413 and also a fifth switch 414 and a sixth switch 415. The construction and the interconnection of these elements likewise corresponds to the construction described in FIG. 3.

In the case of the min-max calibration in accordance with the second test circuit diagram 4, the minimum value of the voltage to be generated by the precision signal generator 201 is also defined, to be precise by the third reference signal generator 411. In the case of the second test circuit diagram 4, five lines are led directly alongside one another, to be precise the third test signal line 409 with the third reference line 406, with the second calibration line 407, with the fourth reference line 416 and with the third calibration line 417.

In the test mode with the switch position "T" of the switches 404, 405, 414 and 415, the third comparator 412 continuously checks whether the voltage present at the first input of the third comparator 412 falls below the minimum reference voltage value present at the second input of the third comparator 412. If this is the case, then the third comparator 412 switches and simultaneously turns off the precision signal generator 201. Analogously to this, the second comparator 402 switches if the voltage value present at its second input exceeds the maximum reference voltage value.

In the calibration mode with the switch position "K" of the switches 404, 405, 414 and 415, the comparators 402 and 412 are set by their calibration units 403 and 413 in each case in such a way that they switch exactly upon voltage identity. The calibration mode is usually carried out prior to the test mode.

Figure 5:
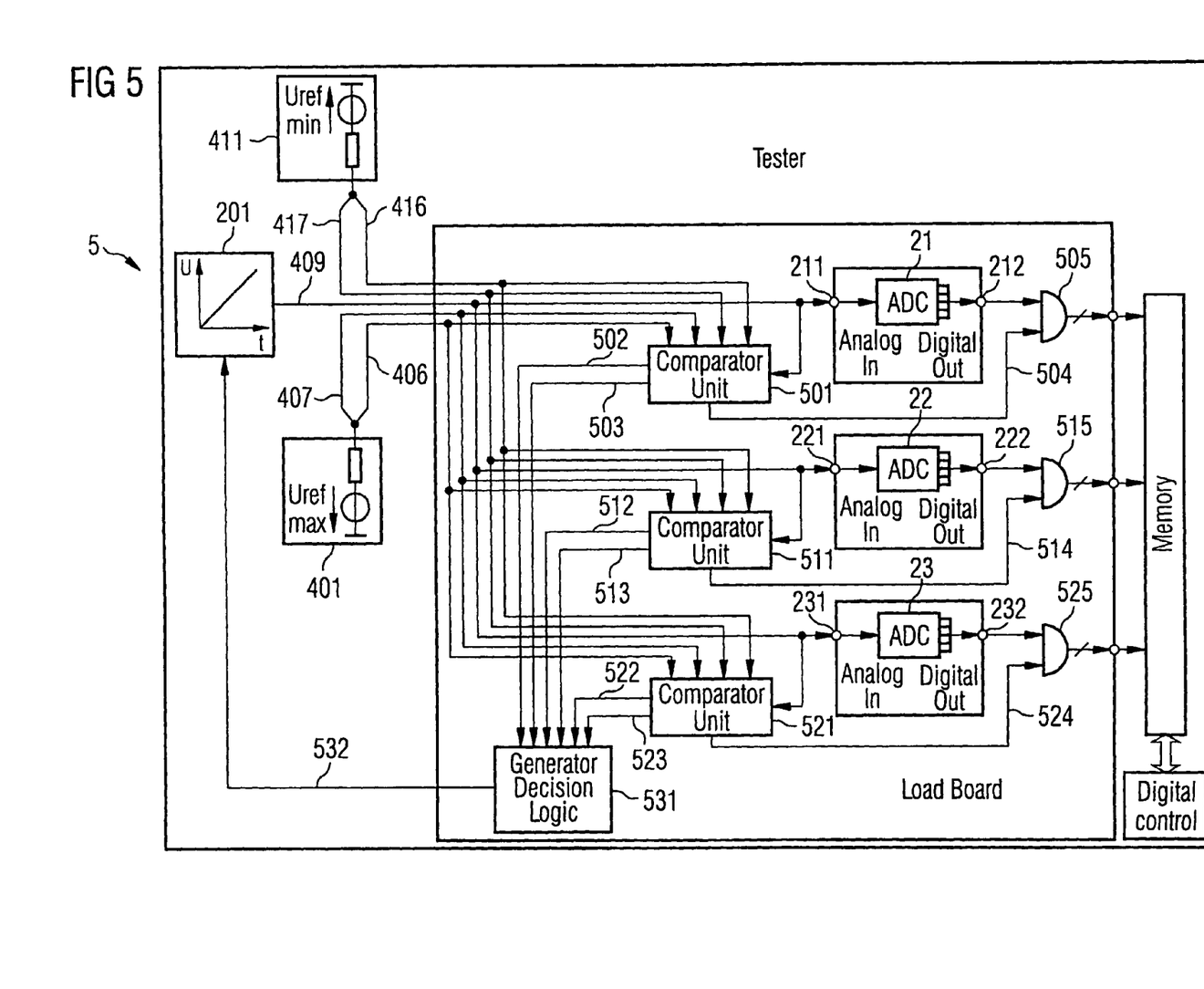
FIG. 5 illustrates one embodiment of a parallel test circuit diagram with three AD converters.

FIG. 5 illustrates a parallel test circuit diagram 5 with the test AD converter 21, with the second AD converter 22 and with the third AD converter 23.

The parallel test circuit diagram 5 comprises, in the same way as the second test circuit diagram 4, the precision signal generator 201, the second reference signal generator 401 and the third reference signal generator 411. For the sake of clarity, the comparators 402 and 412 illustrated in FIG. 4 and also the respectively assigned calibration units 403 and 413 and switches 404, 405, 414 and 415 have been combined in FIG. 5 respectively to form a first comparator unit 501, a second comparator unit 511 and a third comparator unit 521.

As can be seen in FIG. 5, the third reference line 406 and the second calibration line 407 of the second reference signal generator 401 and also the fourth reference line 416 and the third calibration line 417 of the third reference signal generator 411 are in each case branched and led to the comparator units 501, 511 and 521.

The third test signal line 409 issuing from the precision signal generator 201 is likewise branched and led both to the input contacts 211, 221 and 231 and to the comparator units 501, 511 and 521.

A first AND gate 505, a second AND gate 515 and a third AND gate 525 are respectively provided downstream of the output contacts 212, 222 and 232, the output contacts 212, 222 and 232 respectively being connected to the first input of said AND gates.

A first validation signal line 504 extends from the first comparator unit 501 to the first AND gate 505. Likewise, a second and a third validation signal line 514 and 524 respectively pass from the comparator units 511 and 521 to the AND gates 515 and 525.

Furthermore, the parallel test circuit diagram 5 comprises a decision logic unit 531, which is likewise arranged on the load board. The comparator units 501, 511 and 521 are connected to the decision logic unit 531 by means of output signal lines 502, 503, 512, 513, 522 and 523. The decision logic unit 531 is connected to the precision signal generator 201 by means of a control signal line 532.

Each of the AD converters 21-23 has a dedicated calibration unit 501, 511 and 521 at its input contact 211, 221 and 231, said calibration unit being supplied with five lines, to be precise with a respective calibration line 406 and with a respective reference line 407 for the maximum voltage level, with a respective calibration line 417 and with a respective reference line 416 for the minimum voltage level and also with a test signal line 409 for the analog ramp signal.

The comparator units 501, 511 and 521 are calibrated in parallel prior to the beginning of each test cycle. In this calibration mode, the output signals of the calibration units which are contained in the comparator units 501, 511 and 521 and are not shown separately in FIG. 5 are passed jointly to the decision logic unit 531, which derives the control signals for the precision signal generator 201 from these signals. The derivation of these control signals is clear to the person skilled in the art from the information contained in this patent specification and need not be explained in any greater detail here.

The AD converters 21-23 are subsequently tested in the test mode. If test values lying outside the permissible interval are ascertained by one of the comparator units 501, 511 and 521, then the precision signal generator 201 is turned off by the decision logic unit 531.

On account of external disturbances or due to the influence of the different signal paths, it is possible that the measurement operation in the case of the AD converters 21-23 will start and end at slightly offset times. Therefore, the valid time window must be communicated to the tester 105 or the evaluation logic present on the tester 105. This is done by means of a validation signal which is generated by the comparator units 501, 511 and 521 and is communicated to the AND gates 505, 515 and 525 via the validation signal lines 504, 514, 524.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A test device for testing integrated circuits, including dynamic AD converters, the test device comprising:
   a precision signal generator, configured for generating a test signal and coupled to an input contact for coupling to an input of an integrated circuit;
   at least one reference signal generator configured for generating a reference signal the reference signal generator having a calibration line and a reference line; and
   at least one comparator unit for the input contact, the comparator unit being connected to the calibration line and to the reference line of the reference signal generator and having a calibration unit, the comparator unit being operable in a test mode and being configured such that the test signal is compared with the reference signal and that the precision signal generator can be turned off by the comparator unit if the test signal exceeds or falls below the reference signal;
   the comparator unit also being operable in a calibration mode configured such that the switching properties of the comparator unit are adjustable by the calibration unit by means of the signal values of the calibration line which are present at the comparator unit and by means of the reference line.

2. The test device according to claim 1, comprising wherein two reference signal generators are provided, the first reference signal generator configured for generating a lower reference signal and the second reference signal generator configured for generating an upper reference signal, a first comparator unit, which is connectable to the first reference signal generator, and a second comparator unit, which is connectable to the second reference signal generator, being provided for each input contact.

3. The test device according to claim 1, comprising wherein the comparator unit is switchable back and forth between the test mode and the calibration mode.

4. A test device for testing integrated circuits, including dynamic AD converters, the test device comprising:
   a precision signal generator, configured for generating a test signal and coupled to an input contact for coupling to an input of an integrated circuit;
   at least one reference signal generator configured for generating a reference signal; and
   at least one comparator unit for the input contact, the comparator unit being operable in a test mode and being configured such that the test signal is compared with the reference signal and that the precision signal generator can be turned off by the comparator unit if the test signal exceeds or falls below the reference signal;
   wherein the comparator unit includes a comparator that has two inputs and an output, the first input of the comparator being coupled to the reference line of the reference signal generator, the second input of the comparator being coupled to the calibration line of the reference signal generator and to the connecting line of the input contact for coupling to the input of the integrated circuit, the output of the comparator being coupled to the calibration unit and to the precision signal generator and the switching properties of the calibration unit being adjustable by the comparator.

5. A test device for testing integrated circuits, including dynamic AD converters, the test device comprising:
   a precision signal generator, configured for generating a test signal and coupled to an input contact for coupling to an input of an integrated circuit;
   at least one reference signal generator configured for generating a reference signal; and
   at least one comparator unit for the input contact, the comparator unit being operable in a test mode and being configured such that the test signal is compared with the reference signal and that the precision signal generator can be turned off by the comparator unit if the test signal exceeds or falls below the reference signal;
   wherein a decision logic unit is coupled to the comparator unit and which is configured such that control signals are generated for the precision signal generator from the output signals of the comparator unit.

6. The test device according to claim 1, wherein a respective output contact for coupling to an output of an integrated circuit is provided for each input contact, the output contact being coupled to an output line.

7. The test device according to claim 6, wherein a validation signal line leads from the comparator unit to the relevant output line.

8. The test device according to claim 1, comprising wherein the test device is monolithically integrated on an integrated circuit.

9. A load board for receiving at least one needle card for testing integrated circuits and having at least one test receptacle for testing integrated circuits and for connecting a handler to a tester of integrated circuits, the load board having a test device including dynamic AD converters, the test device comprising:
   a precision signal generator, configured for generating a test signal and coupled to an input contact for coupling to an input of an integrated circuit;
   at least one reference signal generator configured for generating a reference signal; and at least one comparator unit for the input contact, the comparator unit being operable in a test mode and being configured such that the test signal is compared with the reference signal and that the precision signal generator can be turned off by the comparator unit if the test signal exceeds or falls below the reference signal.

10. A tester for testing integrated circuits comprising:
a plurality of instruments for generating signals or data streams; and a plurality of measuring sensors, for currents and voltages,
the tester having a load board for receiving at least one needle card for testing integrated circuits and for connecting a handler to a tester of integrated circuits and which is equipped with at least one test receptacle for testing integrated circuits; and
a test device including dynamic AD converters, the test device comprising:
 a precision signal generator, configured for generating a test signal and coupled to an input contact for coupling to an input of an integrated circuit;
 at least one reference signal generator configured for generating a reference signal; and
 at least one comparator unit for the input contact, the comparator unit being operable in a test mode and being configured such that the test signal is compared with the reference signal and that the precision signal generator can be turned off by the comparator unit if the test signal exceeds or falls below the reference signal;
the precision signal generator and the reference signal generator being formed on the tester, and the comparator unit with the calibration unit being arranged on the load board, adjacent to the input contacts for the integrated circuits.

11. A method for parallel testing of integrated circuits comprising:
providing a tester having a load board configured for receiving a plurality of needle cards for testing integrated circuits and for connecting a handler to a tester of integrated circuits and which is equipped with a plurality of test receptacles for testing integrated circuits;
populating the load board with a plurality of integrated circuits, a precision signal generator, at least one reference signal generator and, for each integrated circuit, a comparator unit;
carrying out a test mode having the following process:
generation of a test signal by a precision signal generator and application of the test signal to the integrated circuits;
generation of at least one reference signal by the reference signal generator and application of the reference signal/reference signals to the comparator units; and
comparison of the test signal with the respective reference signal by the comparator units;
turning-off of the precision signal generator by one of the comparator units if the test signal exceeds or falls below the reference signal.

12. The method according to claim 11, wherein the reference signal generator has a calibration line and a reference line, in which case, before or after the test mode is carried out, a calibration mode having the following process comprises:
connecting the comparator unit to the calibration line and to the reference line of the relevant reference signal generator; and
setting the switching properties of the comparator units by means of the signal values of the calibration and the reference line which are present at the relevant comparator units.

13. A storage medium containing a computer program for executing the method for parallel testing of integrated circuits set forth in claim 11.

14. A test device for testing integrated circuits, including dynamic AD converters, the test device comprising:
signal generator, configured for generating a test signal and coupled to an input contact for coupling to an input of an integrated circuit;
at least one reference signal generator configured for generating a reference signal; and
at least one comparator unit for input contact, the comparator unit being operable in a test mode and being configured such that the test signal is compared with the reference signal and that the precision signal generator can be turned off by the comparator unit if the test signal exceeds or falls below the reference signal, wherein two reference signal generators are provided, the first reference signal generator configured for generating a lower reference signal and the second reference signal generator configured for generating an upper reference signal, a first comparator unit, which is connectable to the first reference signal generator, and a second comparator unit, which is connectable to the second reference signal generator, being provided for each input contact;
wherein the first and second reference signal generator each have a calibration line and a reference line, each comparator unit being connected to the calibration line and to the reference line of the relevant reference signal generator, each comparator unit having a calibration unit, and the comparator unit also being operable in a calibration mode configured such that the switching properties of the comparator unit are adjustable by the calibration unit by means of the signal values of the calibration line which are present at the comparator unit and by means of the reference line.

15. The test device according to claim 14, comprising wherein each comparator unit is switchable back and forth between the test mode and the calibration mode.

16. A test device for parallel testing a plurality of integrated circuits, including dynamic AD converters, the test device comprising:
 a precision signal generator, configured for generating a test signal and coupled to at least two input contacts for coupling to an input of an integrated circuit;
 at least one reference signal generator configured for generating a reference signal; and
 at least one comparator unit for each input contact, the comparator unit being operable in a test mode and being configured such that the test signal is compared with the reference signal and that the precision signal generator can be turned off by the comparator unit if the test signal exceeds or falls below the reference signal.

17. The test device according to claim 16, wherein two reference signal generators are provided, the first reference signal generator configured for generating a lower reference signal and the second reference signal generator configured for generating an upper reference signal, a first comparator unit, which is connectable to the first reference signal generator, and a second comparator unit, which is connectable to the second reference signal generator, being provided for each input contact.

18. The test device according to claim 16, wherein the reference signal generator has a calibration line and a reference line, the comparator unit being connected to the calibration line and to the reference line of the reference signal generator, comparator unit having a calibration unit, and the comparator unit also being operable in a calibration mode configured such that the switching properties of the comparator unit are adjustable by the calibration unit by means of the signal values of the calibration line which are present at the comparator unit and by means of the reference line.

* * * * *